(12) United States Patent
Kludt et al.

(10) Patent No.: US 8,619,927 B2
(45) Date of Patent: Dec. 31, 2013

(54) SYSTEM AND METHOD FOR DISCRETE GAIN CONTROL IN HYBRID MIMO/RF BEAMFORMING

(71) Applicant: Magnolia Broadband Inc., Warren, NJ (US)

(72) Inventors: Kenneth Kludt, San Jose, CA (US); Eduardo Abreu, Allentown, PA (US); Haim Harel, New York, NY (US)

(73) Assignee: Magnolia Broadband Inc., Englewood, NJ (US)

( * ) Notice: Subject to any disclaimer, the term of this patent is extended or adjusted under 35 U.S.C. 154(b) by 0 days.

(21) Appl. No.: 13/762,188

(22) Filed: Feb. 7, 2013

(65) Prior Publication Data
US 2013/0322559 A1 Dec. 5, 2013

Related U.S. Application Data

(63) Continuation-in-part of application No. 13/630,146, filed on Sep. 28, 2012.

(60) Provisional application No. 61/652,743, filed on May 29, 2012, provisional application No. 61/657,999, filed on Jun. 11, 2012, provisional application No. 61/665,592, filed on Jun. 28, 2012, provisional application No. 61/658,015, filed on Jun. 11, 2012, provisional application No. 61/658,001, filed on Jun. 11, 2012, provisional application No. 61/658,004, filed on Jun. 11, 2012, provisional application No. 61/665,590, filed on Jun. 28, 2012, provisional application No. 61/667,053, filed on Jul. 2, 2012, provisional application No. 61/665,605, filed on Jun. 28, 2012.

(51) Int. Cl.
| H04L 1/02 | (2006.01) |
| H04L 27/08 | (2006.01) |
| H04B 7/08 | (2006.01) |
| H04B 1/06 | (2006.01) |

(52) U.S. Cl.
USPC ......... 375/347; 375/345; 455/132; 455/232.1

(58) Field of Classification Search
USPC .......... 375/260, 267, 316, 347, 345; 455/132, 455/133, 136–139, 232.1, 234.1, 234.2
See application file for complete search history.

(56) References Cited

U.S. PATENT DOCUMENTS

| 5,915,215 A | 6/1999 | Williams et al. |
| 6,226,507 B1 * | 5/2001 | Ramesh et al. ............ 455/277.1 |

(Continued)

FOREIGN PATENT DOCUMENTS

| EP | 1 867 177 | 5/2010 |
| EP | 2 234 355 | 9/2010 |

(Continued)

OTHER PUBLICATIONS

Office Action issued by the United States Patent and Trademark Office for U.S. Appl. No. 13/630,146 dated Jan. 22, 2013.

(Continued)

*Primary Examiner* — Tesfaldet Bocure
(74) *Attorney, Agent, or Firm* — Pearl Cohen Zedek Latzer Baratz LLP

(57) ABSTRACT

A system for selectively and discretely amplifying or attenuating antennas in a hybrid multiple-input-multiple-output (MIMO) radio distribution network (RDN) receiving system is provided herein. The system includes a MIMO receiving system comprising a MIMO baseband module having N branches; an RDN connected to the MIMO receiving system, the RDN comprising at least one beamformer fed by two or more antennas, so that a total number of antennas in the system is M, wherein M is greater than N, wherein each one of the beamformers include a passive combiner configured to combine signals coming from the antennas coupled to a respective beamformer into a combined signal, wherein the at least one beamformer is further configured to selectively amplify or attenuate in discrete steps, one or more of the signals coming from the M antennas, based on qualitative metrics measured by the MIMO baseband module.

19 Claims, 10 Drawing Sheets

(56) References Cited

U.S. PATENT DOCUMENTS

| | | | |
|---|---|---|---|
| 6,321,077 B1 * | 11/2001 | Saitoh et al. | 455/345 |
| 6,377,783 B1 | 4/2002 | Lo et al. | |
| 6,927,646 B2 | 8/2005 | Niemi | |
| 6,987,958 B1 | 1/2006 | Lo et al. | |
| 7,257,425 B2 | 8/2007 | Wang et al. | |
| 7,299,072 B2 | 11/2007 | Ninomiya | |
| 7,499,109 B2 | 3/2009 | Kim et al. | |
| 7,742,000 B2 | 6/2010 | Mohamadi | |
| 7,769,107 B2 | 8/2010 | Sandhu et al. | |
| 7,898,478 B2 | 3/2011 | Niu et al. | |
| 8,155,613 B2 | 4/2012 | Kent et al. | |
| 8,294,625 B2 * | 10/2012 | Kittinger et al. | 343/713 |
| 8,306,012 B2 | 11/2012 | Lindoff et al. | |
| 8,369,436 B2 | 2/2013 | Stirling-Gallacher | |
| 8,509,190 B2 | 8/2013 | Rofougaran | |
| 8,520,657 B2 | 8/2013 | Rofougaran | |
| 2004/0125900 A1 | 7/2004 | Liu et al. | |
| 2005/0129155 A1 * | 6/2005 | Hoshino | 375/347 |
| 2005/0245224 A1 * | 11/2005 | Kurioka | 455/272 |
| 2005/0287962 A1 | 12/2005 | Mehta et al. | |
| 2006/0135097 A1 * | 6/2006 | Wang et al. | 455/132 |
| 2006/0264184 A1 | 11/2006 | Li et al. | |
| 2006/0270343 A1 | 11/2006 | Cha et al. | |
| 2006/0285507 A1 | 12/2006 | Kinder et al. | |
| 2008/0051037 A1 | 2/2008 | Molnar et al. | |
| 2008/0144737 A1 | 6/2008 | Naguib | |
| 2008/0238808 A1 * | 10/2008 | Arita et al. | 343/893 |
| 2009/0028225 A1 * | 1/2009 | Runyon et al. | 375/219 |
| 2009/0058724 A1 | 3/2009 | Xia et al. | |
| 2009/0121935 A1 | 5/2009 | Xia et al. | |
| 2009/0190541 A1 | 7/2009 | Abedi | |
| 2009/0268616 A1 | 10/2009 | Hosomi | |
| 2009/0322613 A1 | 12/2009 | Bala et al. | |
| 2010/0040369 A1 | 2/2010 | Zhao et al. | |
| 2010/0172429 A1 * | 7/2010 | Nagahama et al. | 375/267 |
| 2010/0195560 A1 | 8/2010 | Nozaki et al. | |
| 2010/0285752 A1 | 11/2010 | Lakshmanan et al. | |
| 2010/0316043 A1 | 12/2010 | Doi et al. | |
| 2011/0032972 A1 | 2/2011 | Wang et al. | |
| 2011/0150050 A1 | 6/2011 | Trigui et al. | |
| 2011/0205883 A1 | 8/2011 | Mihota | |
| 2011/0249576 A1 | 10/2011 | Chrisikos et al. | |
| 2011/0273977 A1 | 11/2011 | Shapira et al. | |
| 2011/0281541 A1 | 11/2011 | Borremans | |
| 2012/0014377 A1 | 1/2012 | Joergensen et al. | |
| 2012/0020396 A1 | 1/2012 | Hohne et al. | |
| 2012/0033761 A1 | 2/2012 | Guo et al. | |
| 2012/0034952 A1 | 2/2012 | Lo et al. | |
| 2012/0064838 A1 | 3/2012 | Miao et al. | |
| 2012/0230380 A1 | 9/2012 | Keusgen et al. | |
| 2013/0079048 A1 | 3/2013 | Cai et al. | |
| 2013/0208619 A1 | 8/2013 | Kudo et al. | |
| 2013/0223400 A1 | 8/2013 | Seo et al. | |
| 2013/0242976 A1 | 9/2013 | Katayama et al. | |

FOREIGN PATENT DOCUMENTS

| | | |
|---|---|---|
| WO | WO 03/047033 | 6/2003 |
| WO | WO 03/073645 | 9/2003 |
| WO | WO 2010/085854 | 8/2010 |
| WO | WO 2011/060058 | 5/2011 |

OTHER PUBLICATIONS

Office Action issued by the United States Patent and Trademark Office for U.S. Appl. No. 13/630,146 dated Mar. 27, 2013.
Office Action issued by the United States Patent and Trademark Office for U.S. Appl. No. 13/762,159 dated Apr. 16, 2013.
Office Action issued by the United States Patent and Trademark Office for U.S. Appl. No. 13/762,191 dated May 2, 2013.
Office Action issued by the United States Patent and Trademark Office for U.S. Appl. No. 13/955,320 dated Oct. 15, 2013.
Office Action issued by the United States Patent and Trademark Office for U.S. Appl. No. 13/776,204 dated Oct. 23, 2013.
Office Action issued by the United States Patent and Trademark Office for U.S. Appl. No. 13/925,454 dated Oct. 28, 2013.
Office Action issued by the United States Patent and Trademark Office for U.S. Appl. No. 13/955,194 dated Oct. 30, 2013.
Office Action issued by the United States Patent and Trademark Office for U.S. Appl. No. 14/013,190 dated Nov. 5, 2013.
Office Action issued by the United States Patent and Trademark Office for U.S. Appl. No. 13/776,068 dated Nov. 5, 2013.
Office Action issued by the United States Patent and Trademark Office for U.S. Appl. No. 13/775,886 dated Jul. 17, 2013.
Notice of Allowance issued by the United States Patent and Trademark Office for U.S. Appl. No. 13/762,191 dated Jul. 19, 2013.
Notice of Allowance issued by the United States Patent and Trademark Office for U.S. Appl. No. 13/630,146 dated Jul. 31, 2013.
Partial International Search Report for International Application No. PCT/US2013/043056 dated Sep. 5, 2013.
Notice of Allowance issued by the United States Patent and Trademark Office for U.S. Appl. No. 13/770,255 dated Sep. 17, 2013.
Ahmadi-Shokouh et al., "Pre-LNA Smart Soft Antenna Selection for MIMO Spatial Multiplexing/Diversity System when Amplifier/Sky Noise Dominates", European Transactions on Telecommunications, Wiley & Sons, Chichester, GB, vol. 21, No. 7, Nov. 1, 2010, pp. 663-677.
Office Action issued by the United States Patent and Trademark Office for U.S. Appl. No. 13/889,150 dated Sep. 25, 2013.

* cited by examiner

SYSTEM AND METHOD FOR DISCRETE GAIN CONTROL IN HYBRID MIMO/RF BEAMFORMING

CROSS-REFERENCE TO RELATED APPLICATIONS

This application is a non-provisional patent application claiming benefit from U.S. provisional patent applications 61/658,015 filed on Jun. 11, 2012; 61/658,001 filed on Jun. 11, 2012; 61/658,004 filed on Jun. 11, 2012; 61/665,590 filed on Jun. 28, 2012; 61/667,053 filed on Jul. 2, 2012; and 61/665,605 filed on Jun. 28, 2012; this application is also a continuation-in-part application of U.S. patent application Ser. No. 13/630,146 filed on Sep. 28, 2012, which claims benefit from U.S. provisional patent applications: 61/652,743 filed on May 29, 2012; 61/657,999 filed on Jun. 11, 2012; and 61/665,592 filed on Jun. 28, 2012, all of which are incorporated by reference herein in their entirety.

FIELD OF THE INVENTION

The present invention relates generally to the field of radio frequency (RF) multiple-input-multiple-output (MIMO) systems and in particular to systems and methods for enhanced performance of RF MIMO systems using RF beamforming and/or digital signal processing.

BACKGROUND OF THE INVENTION

Prior to setting forth a short discussion of the related art, it may be helpful to set forth definitions of certain terms that will be used hereinafter.

The term "MIMO" as used herein, is defined as the use of multiple antennas at both the transmitter and receiver to improve communication performance, where more than one radio, supported by digital signal processing are used. MIMO offers significant increases in data throughput and link range without additional bandwidth or increased transmit power. It achieves this goal by spreading the transmit power over or collecting the received signal from the antennas to achieve spatial multiplexing that improves the spectral efficiency (more bits per second per Hz of bandwidth) or to achieve a diversity gain that improves the link reliability (reduced fading), or increased antenna directivity.

The term "beamforming" sometimes referred to as "spatial filtering" as used herein, is a signal processing technique used in antenna arrays for directional signal transmission or reception. This is achieved by combining elements in the array in such a way that signals at particular angles experience constructive interference while others experience destructive interference. Beamforming can be used at both the transmitting and receiving ends in order to achieve spatial selectivity.

The term "beamformer" as used herein refers to RF circuitry that implements beamforming and usually includes a combiner and may further include switches, controllable phase shifters, and in some cases controllable amplifiers and/or controllable attenuators.

The term "Receiving Radio Distribution Network" or "Rx RDN" or simply "RDN" as used herein is defined as a group of beamformers as set forth above.

The term "hybrid MIMO RDN" as used herein is defined as a MIMO system that employs two or more antennas per channel (N is the number of channels and M is the total number of antennas and M>N). This architecture employs a beamformer for each channel so that two or more antennas are combined for each radio circuit that is connected to each one of the channels.

In hybrid MIMO RDN receiving systems, when the phases of the received signals from each antenna are properly adjusted with respect to one another, the individual signals may be passively combined and result in an improved Signal to Interference plus Noise Ratio (SINR) for the receiving system. A drawback of passive combining schemes is that if the input signals or noises have different powers, theses imbalances may significantly affect the SINR of the combined signal at the output of the combiner of the beamformer and may therefore degrade the gain of the beamformer.

BRIEF SUMMARY OF EMBODIMENTS OF THE INVENTION

According to some embodiments of the present invention, a system for selectively and discretely amplifying or attenuating antennas in a hybrid multiple-input-multiple-output (MIMO) radio distribution network (RDN) receiving system is provided herein. The system may include a MIMO receiving system including MIMO baseband module having N branches; an RDN connected to the MIMO receiving system, the RDN comprised of at least one beamformer fed by two or more antennas, so that a total number of antennas in the system is M, wherein M is greater than N, wherein each one of the beamformers include a passive combiner configured to combine signals coming from the antennas coupled to a respective beamformer into a combined signal, wherein the at least one beamformer is further configured to selectively amplify or attenuate in discrete values, one or more of the signals coming from the M antennas, based on one or more qualitative metrics measured by the MIMO baseband module.

Additional, and/or other aspects and/or advantages of the present invention are set forth in the detailed description which follows.

BRIEF DESCRIPTION OF THE DRAWINGS

For a better understanding of the invention and in order to show how it may be implemented, references are made, purely by way of example, to the accompanying drawings in which like numerals designate corresponding elements or sections. In the accompanying drawings:

FIGS. 5A and 5B to 9A and 9B are graph diagrams illustrating quantitative aspects according to some embodiments of the present invention;

Figure 1:
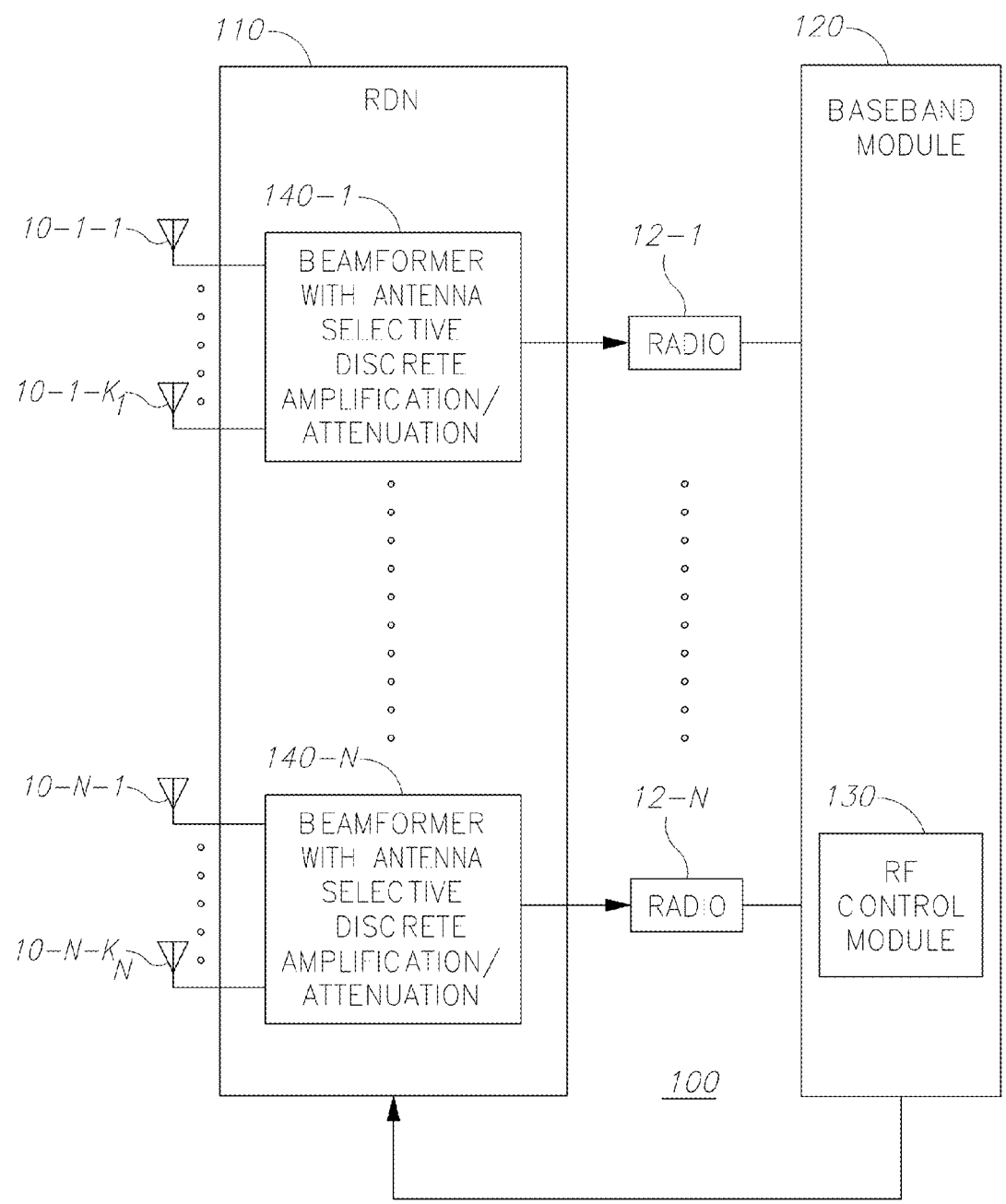
FIG. 1 is a high level block diagram illustrating a system according to embodiments of the present invention.

The drawings together with the following detailed description make the embodiments of the invention apparent to those skilled in the art.

DETAILED DESCRIPTION OF EMBODIMENTS OF THE INVENTION

With specific reference now to the drawings in detail, it is stressed that the particulars shown are for the purpose of example and solely for discussing the preferred embodiments of the present invention, and are presented in the cause of providing what is believed to be the most useful and readily understood description of the principles and conceptual aspects of the invention. In this regard, no attempt is made to show structural details of the invention in more detail than is necessary for a fundamental understanding of the invention. The description taken with the drawings makes apparent to those skilled in the art how the several forms of the invention may be embodied in practice.

Before explaining the embodiments of the invention in detail, it is to be understood that the invention is not limited in its application to the details of construction and the arrangement of the components set forth in the following descriptions or illustrated in the drawings. The invention is applicable to other embodiments and may be practiced or carried out in various ways. Also, it is to be understood that the phraseology and terminology employed herein is for the purpose of description and should not be regarded as limiting.

FIG. 1 is a high level block diagram illustrating a system according to embodiments of the present invention. System 100 comprises a MIMO receiving system set in a hybrid MIMO RDN configuration. In the hybrid MIMO RDN configuration, baseband module 120 receives N branches and is configured to operate, on the baseband level, in accordance with any known or legacy MIMO receiving scheme. System 100 further includes a radio distribution network 110 (RDN) connected to baseband module 120 via radio circuits 12-1 to 12-N. RDN 110 includes at least one beamformer with antenna amplification or attenuation functionality such as 140-1 and 140-N, being fed by two or more antennas such as 10-1-1 to 10-1-$K_1$ through 10-N-1 to 10-N-$K_N$, so that a total number of antennas in system 100 is M=$K_1$+$K_2$+ . . . +$K_N$, wherein M is greater than N. Additionally, each one of the beamformers includes a combiner (not shown here) configured to combine signals coming from the antennas into a single combined signal converted to baseband by radio module 12-1 to 12-N. Baseband module 120 further includes an RF control module 130 being configured to tune RDN 110, for example by adjusting phase shifters located within beamformers 140-1 to 140-N. System 100 includes a beamformer with antenna selective discrete amplification/attenuation such as 140-1 to 140-N for each group of antennas such as 10-1-1 to 10-1-$K_1$ through 10-N-1 to 10-N-$K_N$ that is being combined into a single radio circuit such as 12-1 to 12-N. In operation, any of beamformers 140-1 to 140-N is configured to selectively amplify or attenuate one or more signals coming from the antennas 10-1-1 to 10-1-$K_1$ through 10-N-1 to 10-N-$K_N$ respectively which are combined and feed the respective radio circuits 12-1 to 12-N. The amplification or attenuation is carried out in discrete steps as will be described hereinafter, and the decision which antenna(s) to amplify or attenuate and at what value is carried out at the RF control module 130 in operative association with baseband module 120. As will be explained below, there are many embodiments that may be used in order to implement the selective and discrete amplification/attenuation procedure.

Figure 2:
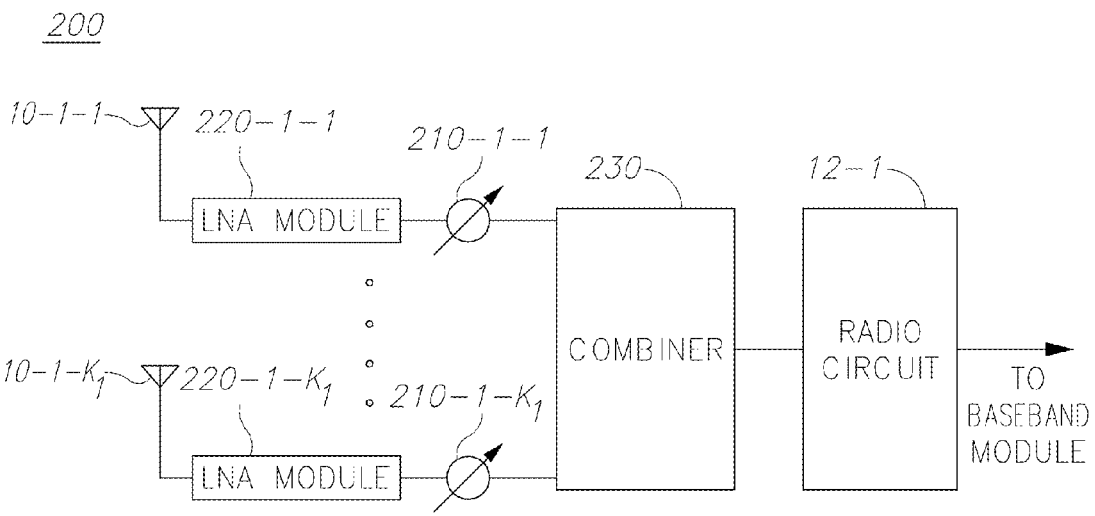
FIG. 2 is a high level block diagram illustrating one aspect of a system according to embodiments of the present invention.

FIG. 2 is a high level block diagram illustrating one aspect of a system according to embodiments of the present invention. System 200 shows a possible implementation in which the selective amplification is carried out by using a low noise amplifier (LNA) module such as 220-1-1 to 220-1-$K_1$, each connected to a respective antenna of 10-1-1 to 10-1-$K_1$ followed by a respective phase shifter 210-1-1 to 210-1-$K_1$ that are used by the control module (not shown here) at the baseband module (not shown here) to tune the phase of antennas 10-1-1 to 10-1-$K_1$. LNA modules 220-1-1 to 220-1-$K_1$ are controlled by the control module of the baseband module by applying discrete levels of gains which are selected on an ad hoc basis for each one of the antenna signals.

According to some embodiments of the present invention, the discrete levels may include maximum gain and "off". Alternatively, the discrete levels include maximum gain, one or more intermediate gain levels, and "off". In a case that the internal noise dominates and the level of the respective signal is below a specific threshold, the gain control module may apply the discrete level "off" to a specific signal coming from the antennas.

Figure 3:
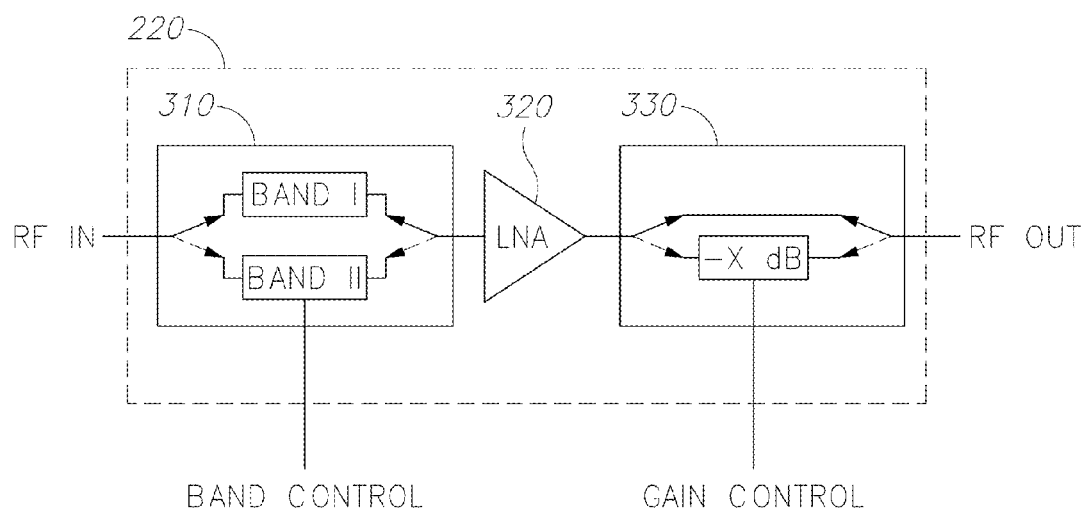
FIG. 3 is a high level block diagram illustrating another aspect of a system according to embodiments of the present invention.

FIG. 3 is a high level block diagram illustrating another aspect of a system according to embodiments of the present invention. Specifically, a possible implementation of the aforementioned LNA module 220 is described. LNA module 220 may include a multiband controllable filter 310. An LNA 320 is followed by a step attenuator 330. The key requirement of LNA module 220 is that the overall gain must be high enough to establish the system noise temperature in the presence of the following cascaded circuit gains and losses. Additionally, LNA module 220 must provide a means to reduce gain to the signal and to its self-generated noise simultaneously. This may be accomplished by providing a continuous control of LNA 320 gain or through discrete gain control by means of step attenuator 330 as shown. The implementation of LNA module 220 may take many forms as may be apparent to anyone skilled in the field of RF circuit design and the effect of cascaded gains and losses to system noise temperature performance. It is noted that in this embodiment, a large number of multiband controllable filters 310 may be required making this embodiment relatively expensive.

Figure 4:
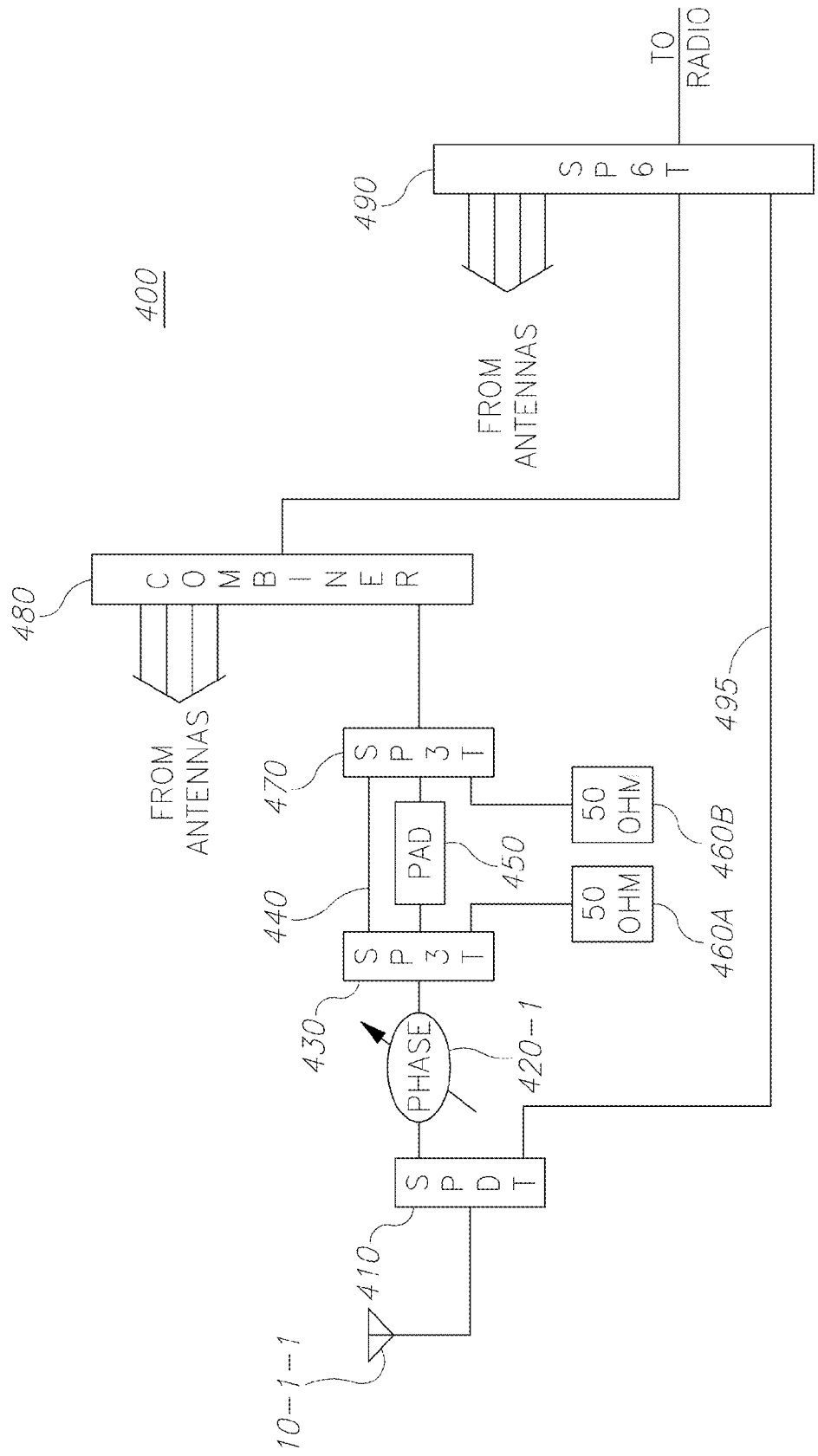
FIG. 4 is a high level block diagram illustrating yet another aspect of a system according to embodiments of the present invention.

FIG. 4 is a passive embodiment that avoids using LNA and LNA filters and is suitable for example when external noise is the dominant noise source. Antenna 10-1-1 (being one of many—not shown) is connected via a switch 410 to a phase shifter 420-1 which is connected to a selection switch 430 which is connected to another selection switch 470 via a short circuit 440, a pad 450 with a predefined attenuation value and an open circuit 460A, 460B. Switch 470 is then connected to a combiner 480 fed by similar circuits of other antennas (not shown). The output of combiner 480 is then connected to a selection switch 490 before going to the radio circuit and the baseband module (not shown here). In some embodiments, the number of discrete values of attenuation is only two, in which case either pad 450 or the open circuit is removed and switches 430 and 470 are replaced with SPDT switches. In some other embodiments, the number of discrete values of attenuation is greater than three, in which case additional pads of different values are added and switches 430 and 470 are expanded accordingly. The aforementioned ternary architecture that allows three different values for the step attenuator (short circuit, pad, open circuit) provides a cost effective manner to change the amplitude of the signals coming from the antennas in a hybrid MIMO RDN architecture. The use of a pad provides an advantage over the more simple solution of merely connecting and disconnecting an antenna (the binary embodiment) by providing a better gain (and average SINR) as will be demonstrated below. A threshold approach may be adopted in operating the step attenuator. Specifically, switching between the possible attenuation values is mapped to specified metric values. One such metric may be for example the MRC (Maximal Ratio Combining) metric defined as the ratio between the RMS signal value and the mean square noise level. In some embodiments, for example when equal noise level (or interference level) is assumed for all antennas, the metric may be simply the rms signal value or the SINR. The metric may normalize to the best signal to a maximum of 1 (i.e., 0 dB reference level), and all others are normalized by the same factor. The metric is compared to one or more thresholds—one threshold for two attenuation steps, two thresholds for three attenuation steps, etc. It should be noted that this threshold approach may be applied to other embodiments such as the embodiment of FIG. 3.

In some embodiments, a controllable bypass 495 may connect switch 410 with selection switch 490 so that combiner 480 is occasionally bypassed. Combiner bypass is desirable in a case that the SINR of all but one antenna in a specific beamformer is worse than the SINR of the best antenna in the beamformer. In that case, the control module is configured to bypass the combiner for the best antenna or attenuate the rest of the antennas. In the cases where the decision is to disconnect all but one antenna as described, the signal can be routed to the radio via path 495 to avoid the combiner losses of 480 thus providing a stronger signal to the radio.

Figure 5A:
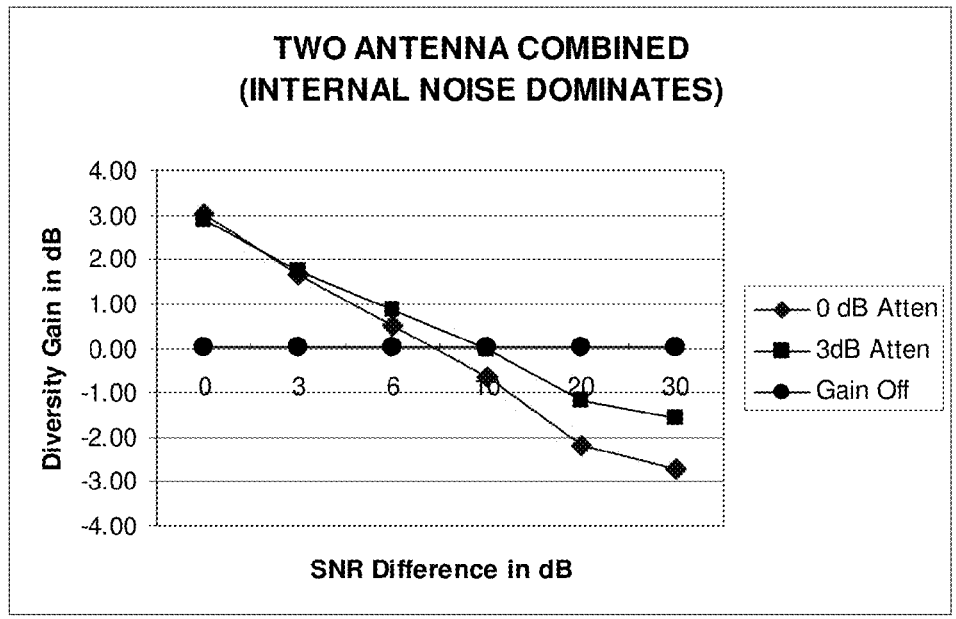
Figure 5B:
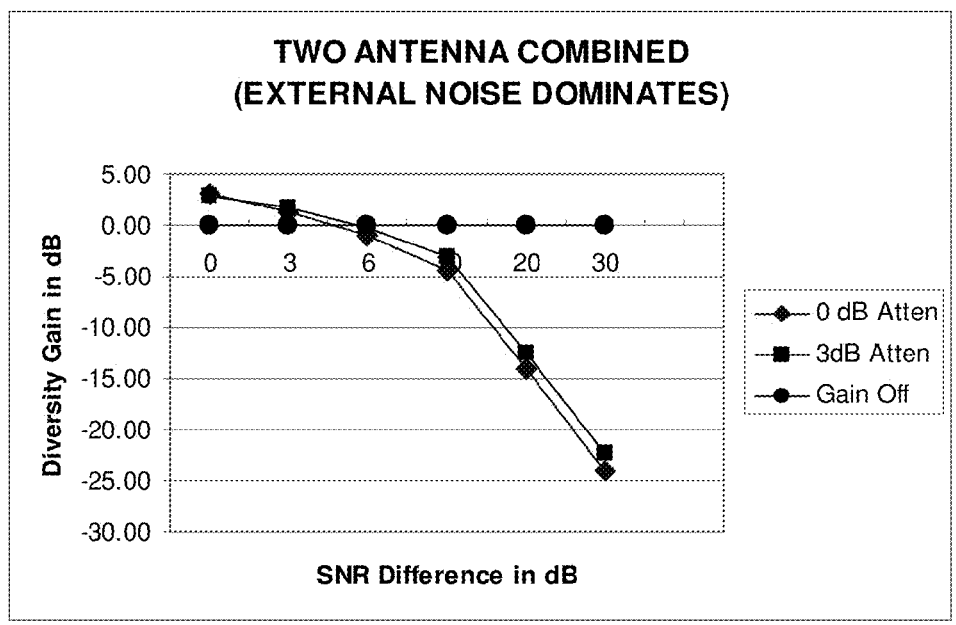
Figure 6A:
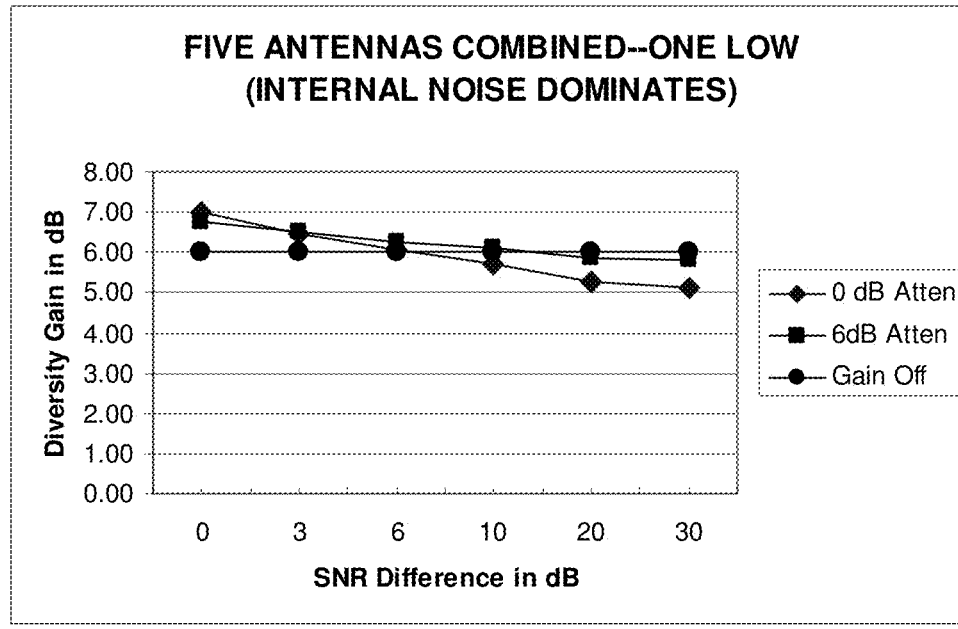
Figure 6B:
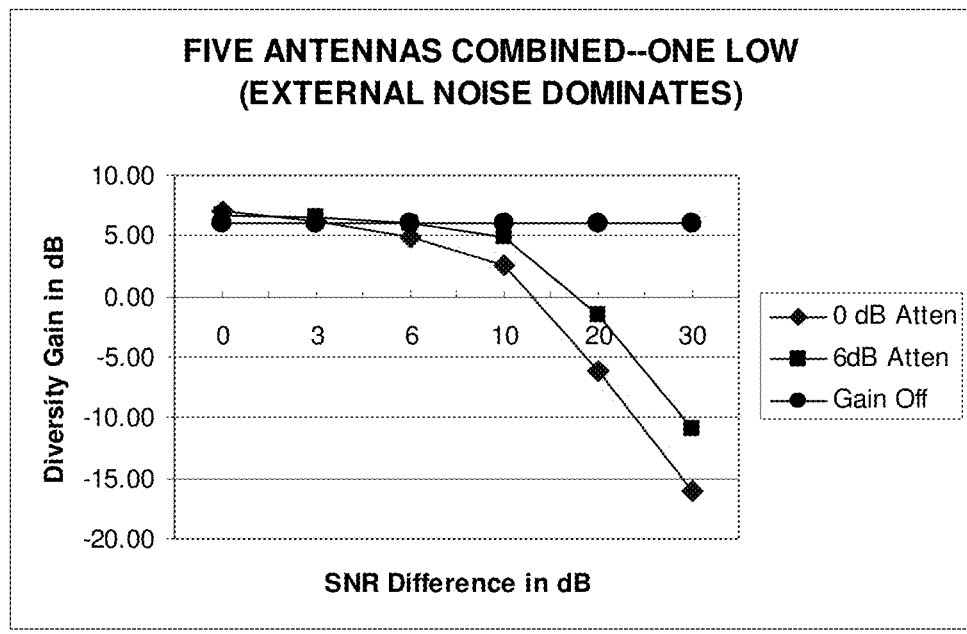
Figure 7A:
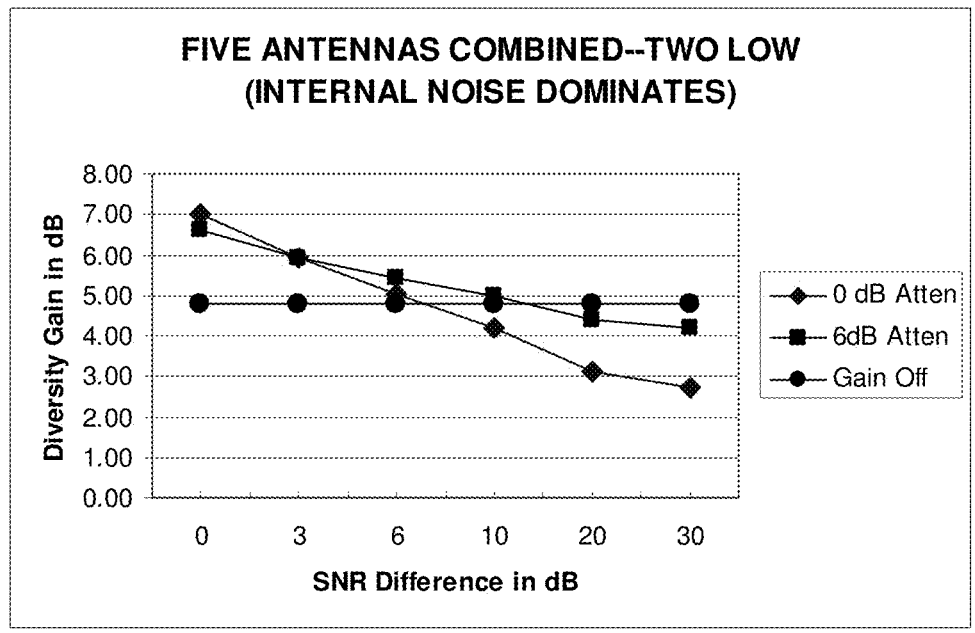
Figure 7B:
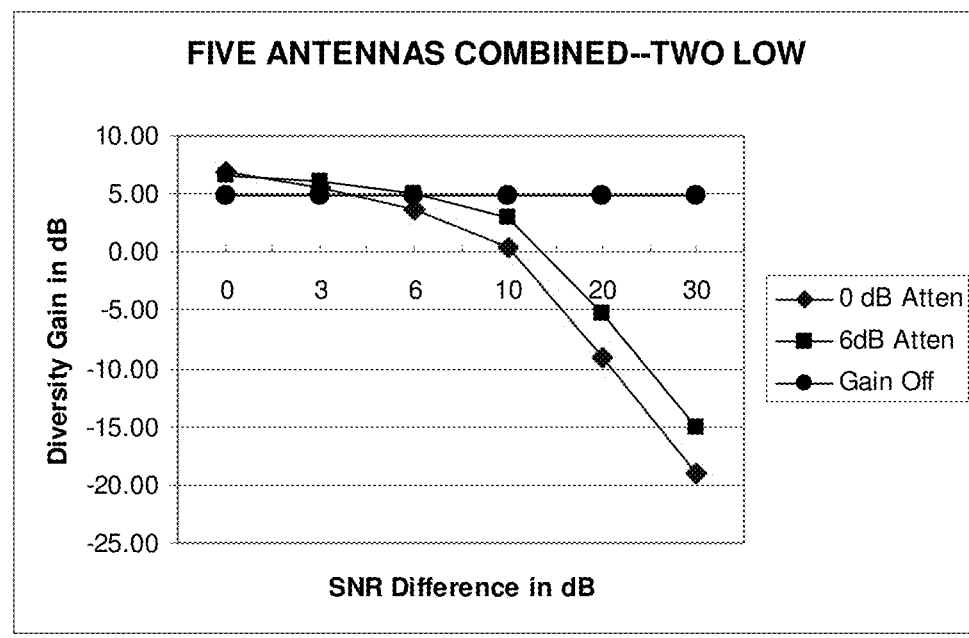
Figure 8A:
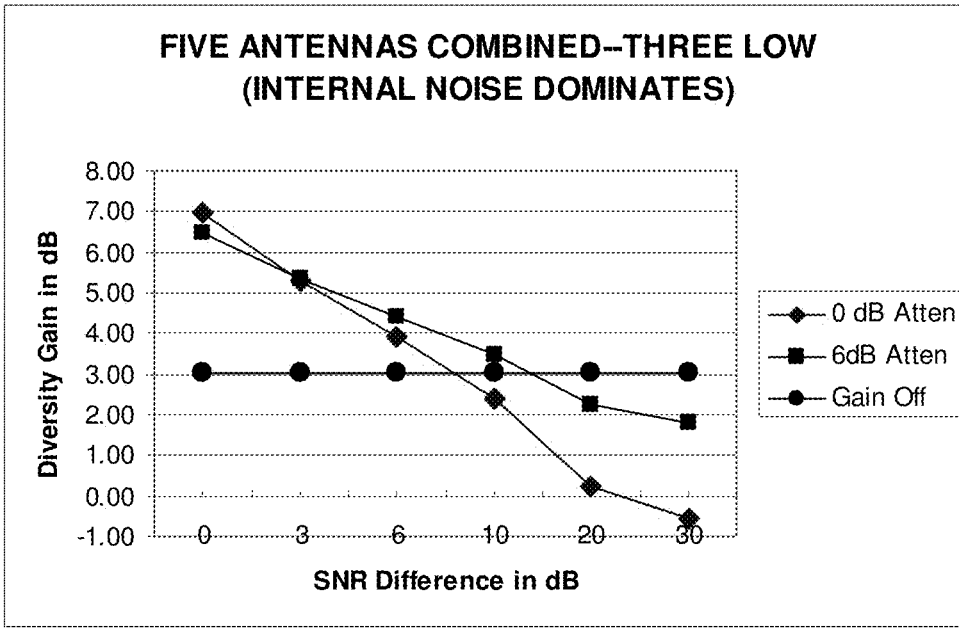
Figure 8B:
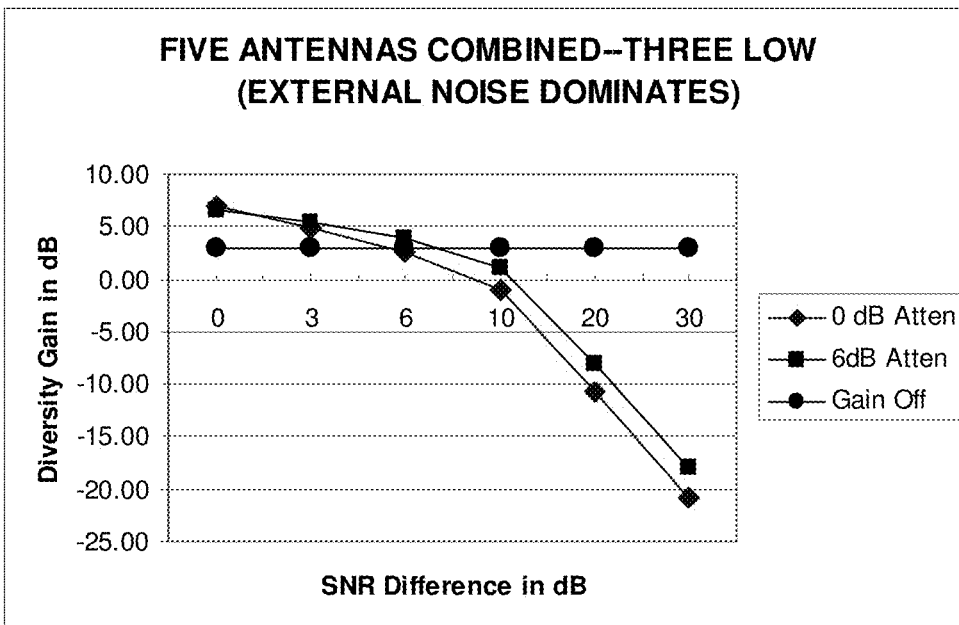
Figure 9A:
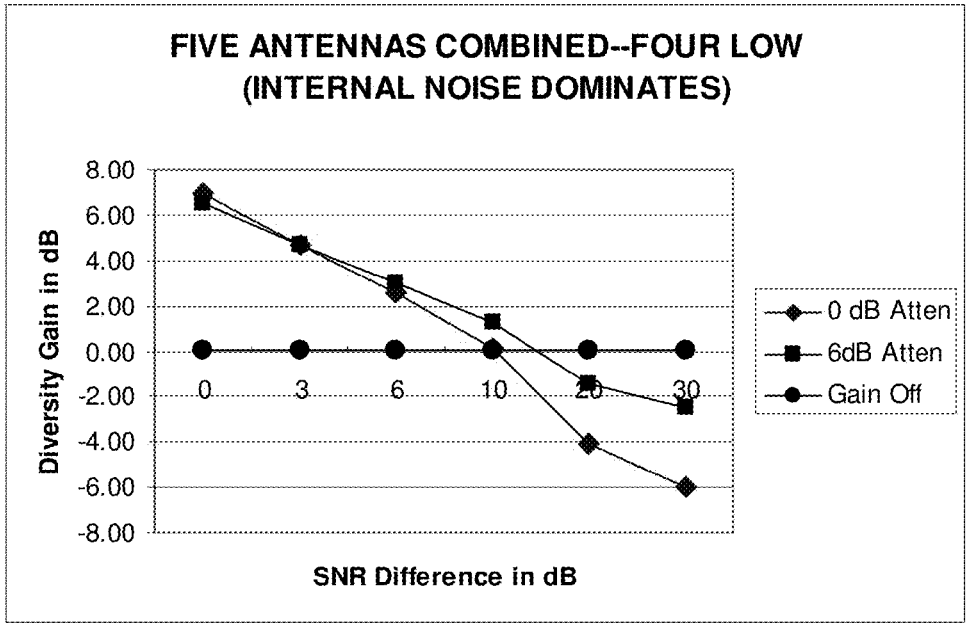
Figure 9B:
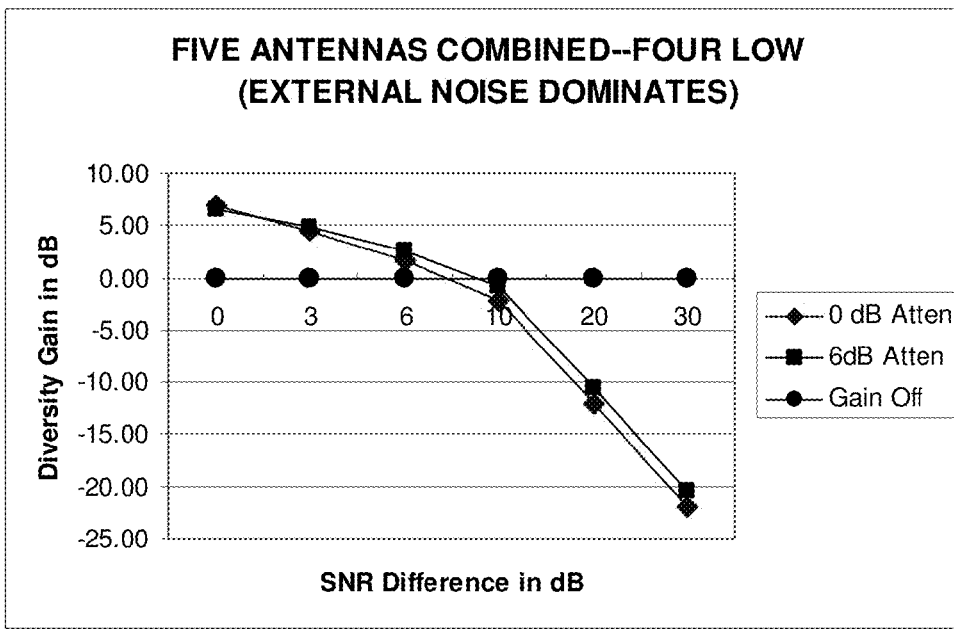

FIGS. 5A and 5B are graph diagrams illustrating a quantitative aspect according to some embodiments of the present invention. These figures show the diversity gain of a two antenna system, defined as the Signal to Noise Ratio (SNR) or SINR improvement of the two antenna system over single antenna, for various signal and noise power levels. In FIG. 5A it is assumed that internal noise dominates, therefore the noise for both antennas have the same power, and the SNR difference between the antennas (the x axis) is due only to signal imbalance. The three curves shown are for three different levels of attenuation applied to one of the antennas: 0 dB, 3 dB and antenna OFF. For 0 dB attenuation, as the SNR difference between the antennas varies from 0 dB to 30 dB, the diversity gain drops from +3 dB when the two input signals (SNR) are equal to almost −3 dB when the weak signal is 30 dB below the stronger. For 3 dB attenuation, the diversity gain is slightly reduced when the two input signals are equal and drops to almost −2 dB for 30 dB SNR difference. With one of the antennas disconnected, the input SNR will be unchanged (i.e., 0 dB gain) as shown by the gain OFF trace. For the purposes of this invention, if the Ohmic and leakage losses in the combiner are neglected, the weak signal should be disconnected at signal ratios of somewhere between −6 dB and −10 dB. For signal ratios closer to each other, the weak signal will still contribute positively to the system performance. In FIG. 5B it is assumed that external noise dominates so that the two antenna signals are held constant and only the noise power varies. The conclusions for both cases, internal or external noise, are similar.

FIGS. 6A and 6B through FIGS. 9A and 9B show that a similar analysis applies to the case where more antennas are combined. Specifically, when internal noise dominates it is illustrated how the diversity gain is reduced by signal imbalance for various numbers of weak signals. It is assumed here that all strong antennas are equal and all weak ones are equal. In each case it is shown how the diversity gain varies between approximately +7 dB when all signals are equal to negative gain when some are weaker. It can be seen in each chart that disconnecting the weak antennas is a better choice as the weak signal levels fall below a threshold level (around −6 to −10 dB for these cases). Similar conclusions apply when external noise dominates. In that case the assumption is that all antennas have equal signal power and only the noise power varies, being equal for the best antennas, and also equal but higher for the "low" antennas.

By looking at FIGS. 6A and 6B through FIGS. 9A and 9B it is possible to calculate the optimal single pad value to be used for discrete MRC. It is assumed the passive solution when each antenna can be combined, disconnected, or fed through a pad. As will be shown below, the inventors have discovered that a single value for a pad can be selected for any number of antennas so that the SNR of the combined signal is optimized. Referring back to FIG. 9A, when all five antennas' SNR are equal, the boundary gain is 7 dB. When three of them are much weaker than some −8 dB, then they will be disconnected, if a pad option does not exist (binary embodiment). An example of selecting a 6 dB PAD for all three weak antennas is demonstrated below, of course assuming for the sake of this chart that all strong ones are equal and all weak ones are equal. As can be seen, the gain curve with such 6 dB PADs crosses the no-pad curve around −3 dB of SNR difference so kicking in the PADs will be done there. Also evident is that that curve crosses the x axis further, at some −12 dB of SNR difference (rather than −8 dB), thus the weak antennas disconnection are preferably done at that point.

The following is an attempt to address the challenge of optimizing the pad value for this case, as well as the general case, with definitions set forth below:

N: number of antennas being passively combined
$s_i$: signal amplitude for antenna i, i=1, 2, ... N
$V_t$: noise power for antenna t, t=1, 2, ... N
$c_i$: linear multiplier (attenuator) for antenna i, i=1, 2, ... N
P: set of discrete multiplier values Assuming P=[0,α,1], the objective is to optimize α. To this end, define a signal to noise ratio R of the combined signal as:

$$R = \frac{\left(\sum_{i=1}^{N} c_i s_i\right)^2}{\sum_{i=1}^{N} c_i^2 V_i^2}$$

For any given set of amplitudes $s_i$ there is a set of multipliers $c_i \in P$ that maximizes R:

$$R_{max} = \max_{c_i \in P} R$$

Since $R_{max}$ depends on α, an optimization criterion is to chose α that maximizes $E\{R_{max}\}$ assuming a Rayleigh distribution for amplitudes $s_i$.

Figure 10:
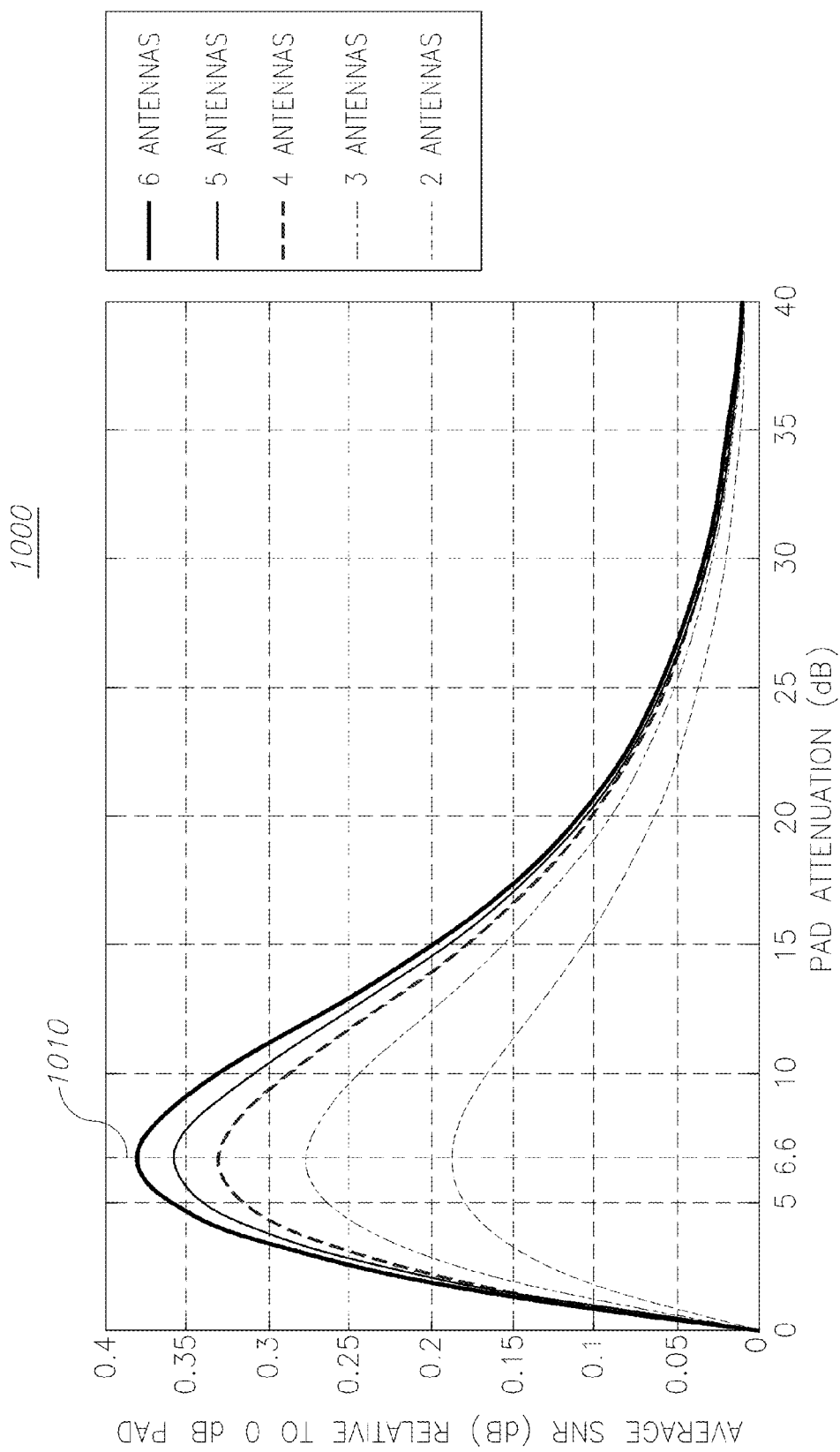
FIG. 10 is a graph diagram illustrating yet another aspect according to some embodiments of the present invention.

FIG. 10 is a graph which illustrates numerically the various expectations of $R_{max}$, or average SNR of the combined signal, resulting from possible selections of pad attenuation (α converted to power attenuation and expressed in dB) assuming equal noise power for all antennas ($V_i$=1) and Rayleigh amplitudes. The averages are normalized with respect to α=1 or 0 dB pad. The five different curves in chart 1000 correspond to number of antennas from two to six. As can be noted, for two antennas, adding the pad increases the expectation by about 0.2 dB versus no pad (α=1). For six antennas the increase is about 0.4 dB. As can be seen, the peak gain for any number of antennas can be achieved by selection of 6.6 dB as a pad—as indicated by line 1010. Using this value is advantageous in implementing a uniform solution for designing pads for reducing to practice embodiments of the present invention. For unequal noise powers, the optimal pad attenuation will be higher than 6.6 dB, however little degradation in performance is observed if a 6.6 dB pad is also used for unequal noise powers. Alternatively, a higher attenuation of, for example, 8 dB could be used for all cases.

Figure 11:
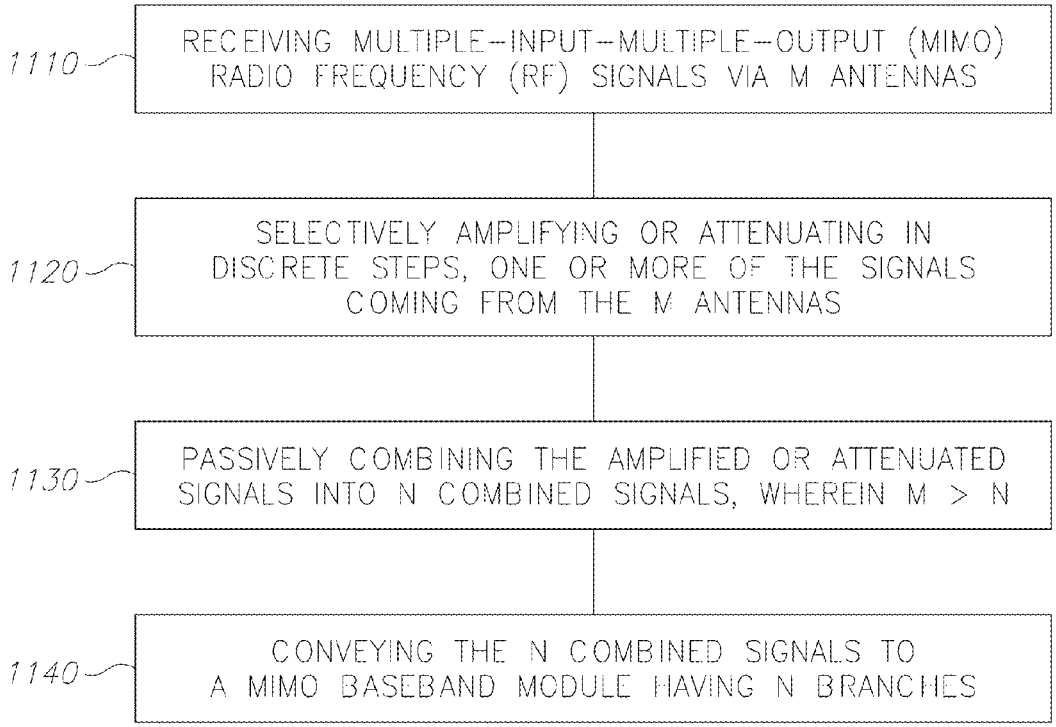
FIG. 11 is a high level flowchart illustrating a method according to some embodiments of the present invention.

FIG. 11 is a high level flowchart illustrating a method 1100 according to some embodiments of the present invention. It is understood that method 1100 may be implemented by any architecture and should not be limited to the aforementioned exemplary embodiments illustrated above. Method 1100 includes the following stages: receiving multiple-input-multiple-output (MIMO) radio frequency (RF) signals via M antennas 1110; selectively amplifying or attenuating in discrete steps, one or more of the signals coming from the M antennas 1120; passively combining the amplified or attenuated signals into N combined signals, wherein M is greater than N 1130; and conveying the N combined signals to a MIMO baseband module having N branches 1140. Additionally, stage 1120 of selectively amplifying or attenuating is carried out based on one or more specified qualitative metrics measured by the MIMO baseband module.

As will be appreciated by one skilled in the art, aspects of the present invention may be embodied as a system, method or an apparatus. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

The aforementioned flowchart and block diagrams illustrate the architecture, functionality, and operation of possible implementations of systems and methods according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In the above description, an embodiment is an example or implementation of the inventions. The various appearances of "one embodiment," "an embodiment" or "some embodiments" do not necessarily all refer to the same embodiments.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Reference in the specification to "some embodiments", "an embodiment", "one embodiment" or "other embodiments" means that a particular feature, structure, or characteristic described in connection with the embodiments is included in at least some embodiments, but not necessarily all embodiments, of the inventions.

It is to be understood that the phraseology and terminology employed herein is not to be construed as limiting and are for descriptive purpose only.

The principles and uses of the teachings of the present invention may be better understood with reference to the accompanying description, figures and examples.

It is to be understood that the details set forth herein do not construe a limitation to an application of the invention.

Furthermore, it is to be understood that the invention can be carried out or practiced in various ways and that the invention can be implemented in embodiments other than the ones outlined in the description above.

It is to be understood that the terms "including", "comprising", "consisting" and grammatical variants thereof do not preclude the addition of one or more components, features, steps, or integers or groups thereof and that the terms are to be construed as specifying components, features, steps or integers.

If the specification or claims refer to "an additional" element, that does not preclude there being more than one of the additional element.

It is to be understood that where the claims or specification refer to "a" or "an" element, such reference is not be construed that there is only one of that element.

It is to be understood that where the specification states that a component, feature, structure, or characteristic "may", "might", "can" or "could" be included, that particular component, feature, structure, or characteristic is not required to be included.

Where applicable, although state diagrams, flow diagrams or both may be used to describe embodiments, the invention is not limited to those diagrams or to the corresponding descriptions. For example, flow need not move through each illustrated box or state, or in exactly the same order as illustrated and described.

The term "method" may refer to manners, means, techniques and procedures for accomplishing a given task including, but not limited to, those manners, means, techniques and procedures either known to, or readily developed from known manners, means, techniques and procedures by practitioners of the art to which the invention belongs.

The descriptions, examples, methods and materials presented in the claims and the specification are not to be construed as limiting but rather as illustrative only.

Meanings of technical and scientific terms used herein are to be commonly understood as by one of ordinary skill in the art to which the invention belongs, unless otherwise defined.

The present invention may be implemented in the testing or practice with methods and materials equivalent or similar to those described herein.

While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

We claim:

1. A system comprising:
    a multiple-input-multiple-output (MIMO) receiving system comprising a MIMO baseband module having N branches; and
    a radio distribution network (RDN) connected to the MIMO receiving system, the RDN comprising at least one beamformer, wherein each one of the beamformers is fed by two or more antennas, so that a total number of antennas in the system is M, wherein M is greater than N, wherein each one of the beamformers includes a passive combiner configured to combine signals coming from the antennas coupled to a respective beamformer into a combined signal, wherein the at least one beamformer is further configured to selectively amplify or attenuate in discrete steps, one or more of the signals coming from the M antennas prior to entering the passive combiners, wherein the amplifying or the attenuating is based on one or more qualitative metrics measured by the MIMO baseband module.

2. The system according to claim 1, further comprising a gain control module having a plurality of gain controlled low noise amplifiers (LNA), each one of the LNA being associated with a different antenna.

3. The system according to claim 1, wherein the MIMO baseband module is configured to separately measure a signal level and signal to interference plus noise ratio (SINR) of each signal coming from the antennas, and wherein the amplifying or the attenuating is based on the measured signal level and SINR of each signal coming from the antennas.

4. The system according to claim 3, wherein the discrete levels include maximum gain and "off".

5. The system according to claim 3, wherein the discrete levels include maximum gain, one or more intermediate gain levels, and "off".

6. The system according to claim 3, further comprising a gain control module, wherein in a case that the internal noise dominates and the level of the respective signal is below a specific threshold, the gain control module applies the discrete level "off" to a specific signal coming from the antennas.

7. The system according to claim 3, further comprising a gain control module, wherein in a case that a measured metric of all but one of the antennas in a specific beamformer is worse than the metric for a specific antenna in the beamformer, the gain control module is configured to bypass the combiner for the specific antenna or attenuate the rest of the antennas based on a threshold.

8. The system according to claim 3, further comprising a gain control module, wherein in a case that a measured metric such as MRC metric of some of the antennas in a specific beamformer is worse than the metric for a specific antenna in the beamformer, the gain control module is configured to selectively attenuate the weak antenna based on a threshold.

9. The system according to claim 3, further comprising a gain control module, wherein in a case that a measured metric such as MRC metric of some of the antennas in a specific beamformer is worse than the metric for a specific antenna in the beamformer, the gain control module is configured to selectively disconnect the weak antenna based on a threshold.

10. The system according to claim 3, further comprising a gain control module having a plurality of cascaded units each comprising a controllable band selector, a low noise amplifier, and a step attenuator, wherein each cascaded unit controls the gain of a different antenna signal.

11. The system according to claim 1, further comprising a gain control module configured to amplify or attenuate one or more of the signals coming from the M antennas using discrete levels.

12. The system according to claim 11, wherein the discrete levels include maximum attenuation and an intermediate attenuation level.

13. The system according to claim 12, wherein the gain control module applies the discrete level maximal attenuation to a specific signal coming from the antennas, in a case that the measured SINR of the respective signal is below a specific threshold.

14. The system according to claim 11, wherein the gain control module comprises a plurality of discrete levels attenuator configured to select between a connector, a pad having a specific attenuation level, and a disconnection, wherein each discrete levels attenuator controls the attenuation of a different antenna signal.

15. The system according to claim 14, wherein the attenuation of the pad is approximately 6.6 dB.

16. A method comprising:
receiving multiple-input-multiple-output (MIMO) radio frequency (RF) signals via M antennas;
separately measuring a signal level and signal to interference plus noise ratio (SINR) of each signal coming from the antennas;
selectively amplifying or attenuating in discrete steps, one or more of the signals coming from the M antennas;
passively combining the amplified or attenuated signals into N combined signals, wherein M is greater than N; and
conveying the N combined signals to a MIMO baseband module having N branches, wherein the selectively amplifying or attenuating is carried out based on one or more specified qualitative metrics measured by the MIMO baseband module, wherein said qualitative metrics include the measured signal level and SINR of each signal coming from the antennas.

17. The method according to claim 16, wherein the discrete levels include maximum gain and "off".

18. The method according to claim 16, wherein the discrete levels include maximum gain, one or more intermediate gain levels, and "off".

19. The method according to claim 16, wherein in a case that the internal noise dominates and the level of the respective signal is below a specific threshold, the amplifying or the attenuating applies the discrete level "off" to a specific signal coming from the antennas.

* * * * *